United States Patent [19]

Nagai et al.

[11] Patent Number: 5,216,404
[45] Date of Patent: Jun. 1, 1993

[54] SIC THIN-FILM THERMISTOR

[75] Inventors: Takeshi Nagai; Shuji Itou, both of Nara; Kunihiro Tsuruda, Kashihara, all of Japan

[73] Assignee: Matsushita Electric Industrial Co., Ltd., Osaka, Japan

[21] Appl. No.: 734,691

[22] Filed: Jul. 23, 1991

[30] Foreign Application Priority Data

Jul. 25, 1990 [JP] Japan .................................. 2-197247
Mar. 22, 1991 [JP] Japan .................................. 3-058648

[51] Int. Cl.⁵ ........................ H01C 7/10; C23C 14/00
[52] U.S. Cl. .................... 338/22 SD; 338/307; 338/308; 338/312; 338/314; 204/192.21
[58] Field of Search ................ 338/22 SD, 22 R, 307, 338/308, 312, 314; 361/103, 106, 402–406; 204/192.21

[56] References Cited

U.S. PATENT DOCUMENTS

| 1,549,394 | 8/1925 | Tyler ..................... 338/262 |
| 3,223,829 | 12/1965 | Davy et al. ............. 338/307 X |
| 3,659,245 | 4/1972 | Payne ..................... 338/312 |
| 3,775,725 | 11/1973 | Endo ..................... 338/262 |
| 3,845,443 | 10/1974 | Fisher . |
| 3,958,209 | 5/1976 | Soda et al. . |
| 4,086,559 | 4/1978 | Knippenberg et al. . |
| 4,208,449 | 6/1980 | Knippenberg et al. . |
| 4,222,025 | 9/1980 | Iles et al. . |
| 4,359,372 | 11/1982 | Nagai et al. . |
| 4,424,507 | 1/1984 | Nagai et al. . |
| 4,777,718 | 10/1988 | Henderson et al. ............ 338/307 X |
| 4,968,964 | 11/1990 | Nagai et al. . |

FOREIGN PATENT DOCUMENTS 0338522 10/1989 European Pat. Off. .
3910861 11/1989 Fed. Rep. of Germany .

Primary Examiner—Marvin M. Lateef
Attorney, Agent, or Firm—Wenderoth, Lind & Ponack

[57] ABSTRACT

A thin-film thermistor element which has an electrically insulating substrate having first and second surfaces opposite to each other and also having a pair of through-holes defined therein so as to extend completely across the thickness thereof, and a pair of electrode films each including a body portion of large surface area and a generally comb-shaped portion continued outwardly from the body portion. The electrode films are formed by the use of a firing process on the first surface of the substrate with the respective comb-shaped portions thereof confronting with each other. First and second electroconductive films are also formed on respective surrounding wall faces defining the corresponding through-holes in the substrate in electrically connected relationship with the body portions of the associated electrode films. A temperature sensitive resistance film is formed by the use of a high frequency sputtering process on the first surface of the substrate so as to overlay the electrode films. A method of making the thermistor element is also disclosed.

12 Claims, 2 Drawing Sheets

SIC THIN-FILM THERMISTOR

BACKGROUND OF THE INVENTION

1. Field of the Invention

The present invention relates to a SiC thin-film thermistor using a sputtered SiC film as a temperature sensitive resistor and, more particularly, to a SiC thin-film thermistor of a type wherein no welding technique is used to connect lead wires.

2. Description of the Prior Art

Numerous temperature sensors comprising metals, metal oxides and other materials have long been used in various commercial products. Of them, a SiC thin-film thermistor is generally considered suitable as a temperature sensor for use in cooking products such as, for example, a microwave oven or the like, because it is known from any one of U.S. Pat. Nos. 4,359,372, 4,424,507 and 4,968,964 to have a capability of detecting a wide range of temperature ranging from 0° to 500° C. with a high sensitivity.

The known thermistor generally comprises a thermistor element and a package enclosing the thermistor element. The thermistor element comprises a sputtered SiC film formed on an electrically insulating substrate made of alumina. The package includes a pair of external lead wires fixed firmly to an insulating body. This type of known thermistor is generally regarded having a problem in that it requires a complicated structure and, also, a complicated manufacturing process which will now be discussed in detail.

The thermistor element is manufactured by the formation of a pair of thick-film electrodes on one surface of an alumina substrate by the use of a firing technique that is carried out before a sputtering. Each of those thick-film electrodes formed on the alumina substrate has first and second portions connected together: The first portion of the respective thick-film electrode is of a generally comb-like configuration and determinative of a thermistor resistance and the second portion thereof has a surface area of 0.25 to 1 mm$^2$ so large as to permit an internal lead wire to be subsequently connected therewith by the use of a welding technique.

The SiC film is subsequently deposited on a surface of the alumina substrate by the use of a radio frequency sputtering technique. Since the internal lead wires cannot be welded to the SiC film, the second electrode portion of each thick-film electrode must be masked to avoid a deposition of the SiC film during the sputtering. Also, since the alumina substrate is kept at a temperature generally higher than 600° C., the material used for masking the second electrode portion to avoid the deposition of the SiC film is required to have a property capable of withstanding the elevated temperature. An alumina plate of generally elongated shape corresponding to the slender shape of the second electrode portion is generally considered one of the most suitable materials for masking purposes because of its high-temperature withstanding capability.

However, in practice, a single sputtering cycle can produce a number of, for example, 1,000 and 1,500, thermistor elements and, therefore, it is a customary practice to arrange a corresponding number of alumina substrates regularly in two dimensions on a flat substrate holder during the sputtering. At the same time, the entire number of second electrode portions of the electrodes which will eventually be formed in those thermistor elements must be masked. While the use of the alumina plate is feasible as the masking material as discussed above, alumina is very hard, but brittle and it is not possible to prepare a single alumina plate of a size sufficient to cover the entire number of second electrode portions. In view of this, it is a conventional practice to manually place the individual alumina plates over the corresponding second electrode portions of the electrodes on the respective alumina substrates which are arranged regularly in two dimensions on the flat substrate holder.

The manual placement of the masking members over the individual electrode portions of the electrodes is not only complicated and cumbersome, but also time-consuming. Although the single masking member of a size sufficient to cover the total surface area of the electrode portions may readily be available if a metallic material other than alumina is used, such a single masking member tends to exhibit a large thermal deformation and can therefore not be used in high-temperature environments in excess of 600° C.

In addition to those problems discussed above, the conventional manufacture of the SiC thin-film thermistor has an additional problem found after the formation of the thermistor element. Specifically, after the formation of the thermistor element, the internal lead wires are welded at one end to the respective second electrode portions of the respective electrodes. Each of the internal lead wires is generally employed in the form of a platinum wire of about 0.1 mm in diameter. Since the internal lead wires are physically weak, these internal lead wires welded at one end to the corresponding second electrode portions are in turn welded at the opposite end to external lead wires each having a practically acceptable physical strength and fixed to an insulating body. Each of those external lead wires is generally in the form of, for example, a generally elongated Fe-Cr alloy plate of 1 to 2 mm in width and 0.3 to 0.6 mm in thickness. In practice, those external lead wires are manually individually welded to the internal lead wires and, therefore, require a complicated and time-consuming procedure.

SUMMARY OF THE INVENTION

In view of the foregoing, the present invention has been devised to provide an improved thin-film thermistor element which can be manufactured with no masking required.

The present invention is also intended to provide an improved thin-film thermistor element of a type wherein the external lead wires are connected directly to the electrode films with no internal lead wire employed.

It is a related object of the present invention to provide an improved method of making the thin-film thermistor element of the type referred to above.

According to one aspect of the present invention, a thin-film thermistor element is provided which comprises an electrically insulating substrate made of alumina, having first and second surfaces opposite to each other and also having a pair of through-holes defined therein so as to extend from the first surface to the second surface thereof completely across the thickness thereof. A pair of electrode films each having a body portion of relatively large surface area and at least one prong protruding outwardly from the body portion are formed on the alumina substrate with the body portions positioned so as to encompass the associated through-holes in the alumina substrate. Each of the through-holes has a surrounding wall provided with a respective intervening conductive film, which may be in the form of a generally tubular thin-walled conductor, with one end thereof connected electrically with the body portion of the associated electrode film.

While in the prior art thermistor element of a similar kind, internal lead wires are welded respectively to the body portions of the associated electrode films formed on one surface of the alumina substrate as hereinbefore discussed, the present invention allows external lead wires to be connected directly to the respective intervening conductive films by the use of associated fired electroconductive films provided on the other surface of the alumina substrate, thereby substantially eliminating the need for masking and the need for internal lead wires.

BRIEF DESCRIPTION OF THE DRAWINGS

These and other objects and features of the present invention will become clear from the following description taken in conjunction with preferred embodiments thereof with reference to the accompanying drawings, in which like parts are designated by like reference numerals and in which.

DETAILED DESCRIPTION OF THE EMBODIMENTS

Figure 1:
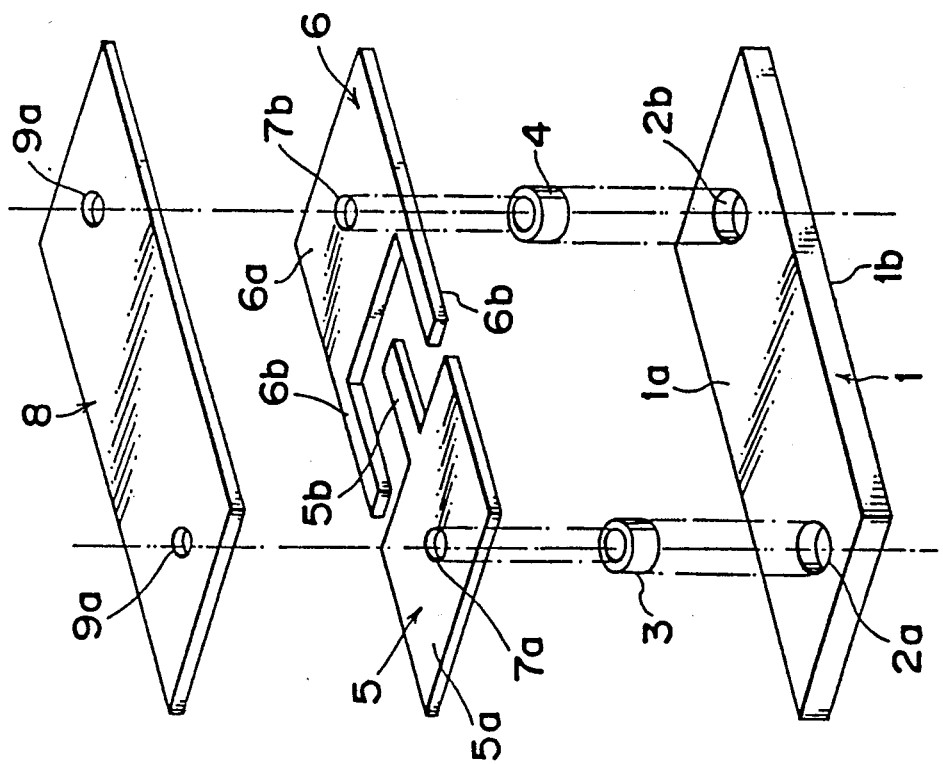
FIG. 1 is an exploded perspective view of a thermistor element according to a preferred embodiment of the present invention.

Referring now to FIG. 1, a SiC thermistor element according to the present invention comprises a generally rectangular alumina substrate 1 having first and second surfaces 1a and 1b opposite to each other and also having a pair of through-holes 2a and 2b defined therein so as to extend from the first surface 1a to the second surface 1b thereof completely across the thickness thereof. This alumina substrate 1 may be of a size, about 1.8 mm in width, about 6.5 mm in length and about 0.5 mm in thickness. Although the diameter of each of the through-holes 2a and 2b may be variable with the size of the alumina substrate 1, it is preferred to be within the range of 0.2 to 1.0 mm for the above noted illustrated size of the alumina substrate 1. Also, the illustrated alumina substrate 1 is of a type containing about 95% alumina and each of the first and second surfaces 1a and 1b thereof has a surface roughness of 2 to 3 μm.

Each of the through-holes 2a and 2b has a surrounding wall lined with a respective electroconductive film to provide a generally tubular thin-walled intervening conductor 3 or 4 extending completely across the thickness of the alumina substrate 1. Any one of those tubular intervening conductors 3 and 4 can be formed by printing any known electroconductive paste, for example, that containing Au, Pt, Au-Pt or Ag-Pd, to the wall surface of the respective through-hole 2a or 2b through an opening in a printing mask (not shown) from a side of the first surface 1a of the alumina substrate 1 and then by firing the printed paste to complete the intervening conductor 3 or 4. Prior to the printing, the printing mask should be placed on the first surface 1a of the alumina substrate 1 with the openings aligned respectively with the through-holes 2a and 2b as exactly as possible.

Figure 2:
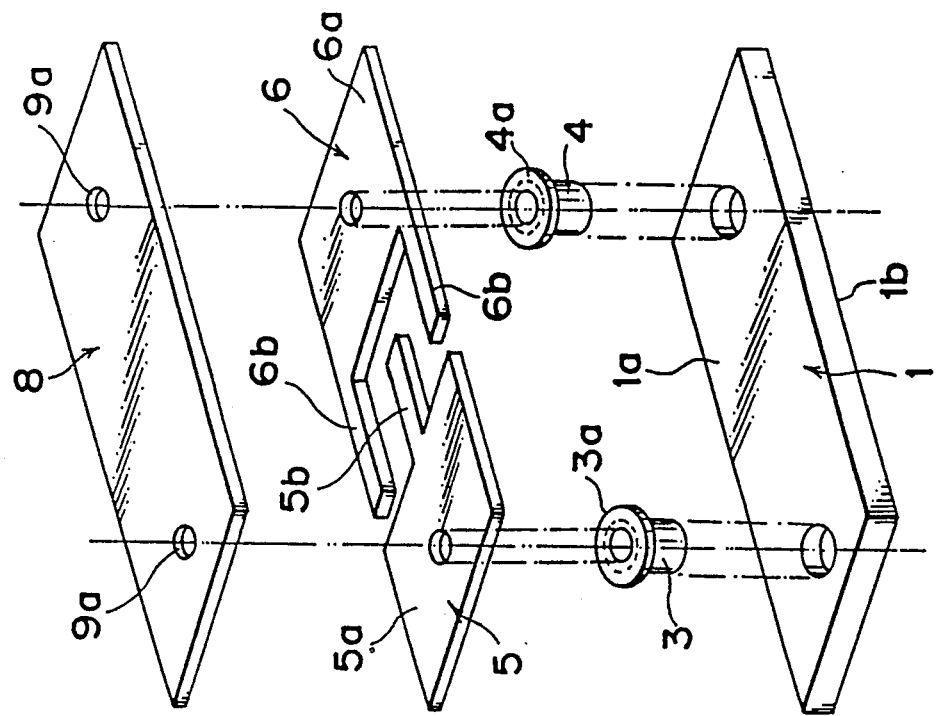
FIG. 2 is a view similar to FIG. 1, showing an alternative preferred embodiment of the present invention.

Each of the openings defined in the printing mask may have a diameter either equal to or greater than the diameter of any one of the through-holes 2a and 2b in the alumina substrate 1. The use of the printing mask having the openings each being greater than the diameter of any one of the through-holes 2a and 2b by 0.1 mm or more is preferred and, in such case, the resultant tubular intervening conductors 3 and 4 can have annular flanges 3a and 4a deposited on the first surface 1a of the alumina substrate 1 while protruding radially outwardly from respective ends of the intervening conductors 3 and 4 as best shown in FIG. 2. Alternatively, the application of the electroconductive paste to eventually form the intervening conductor 3 and 4 may be carried out from the opposite side, i.e., from the second surface 1b of the alumina substrate 1 so that the resultant flanges 3a and 4a can be deposited on the second surface 1b of the alumina substrate 1.

After the formation of the tubular intervening conductors 3 and 4, at least one pair of electrode films 5 and 6 are formed in respective predetermined patterns on the first surface 1a of the alumina substrate 1 by the use of a firing technique. The first electrode film 5 has a generally rectangular body portion 5a of relatively large surface area and at least one prong 5b continued to and protruding outwardly from the body portion 5a whereas the second electrode film 6 has a generally rectangular body portion 6a of relatively large surface area and a pair of prongs 6b continued to and protruding outwardly from the body portion 6a. So far shown, the first and second electrode films 5 and 6 are deposited on the first surface 1a of the alumina substrate 1 with the prong 5b of the first electrode film 5 positioned between the prongs 6b of the second electrode film 6. It is to be noted that, when a SiC film 8 is deposited so as to overlay the first and second electrode films 5 and 6 as will be described later, a portion of the SiC film 8 delimited between the prongs 5b and 6b of the respective first and second electrode films 5 and 6 will be determinative of the characteristic resistance of the resultant thermistor element.

The first and second electrode films 5 and 6 have respective perforations 7a and 7b each left therein in in the body portion 5a or 6a in alignment with the corresponding tubular intervening conductor 3 or 4. With the first and second electrode films 5 and 6 deposited on the first surface 1a of the alumina substrate 1, the first and second electrode films 5 and 6 are thus connected electrically with the respective tubular intervening conductors 3 and 4. As discussed in the U.S. Pat. No. 4,968,964, issued Nov. 6, 1990, and assigned to the same assignee of the present invention, of the known electroconductive pastes, the Au-Pt paste having a firing temperature within the range of 900° to 1,000° C. is a preferable material for each of the first and second electrode films 5 and 6.

Thereafter, a temperature sensitive resistance film which may be in the form of a SiC film 8 is deposited on the alumina substrate 1 so as to overlay the first and second electrode films 5 and 6 by the use of a radio frequency sputtering technique. As is the case with the perforations 7a and 7b in the first and second electrode films 5 and 6, the resultant SiC film 8 has perforations 9a and 9b left therein in alignment with the perforations 7a and 7b in the first and second electrode films 5 and 6. By the reason which will be described later, the SiC film 8 may be vapor-deposited on the alumina substrate 1 so as to cover the entire surface area of the first surface 1a. Conditions used to accomplish the sputtering to form the SiC film 8 are disclosed in the U.S. Pat. No. 4,359,372, issued Nov. 16, 1982, and assigned to the same assignee of the present invention.

It is to be noted that, although in FIGS. 1 and 2 the SiC film 8 is shown to have flat and smooth surfaces opposite to each other, this is not always the case and, in practice, the SiC film 8, when deposited on the alumina substrate 1 by the use of the sputtering technique, may represent an undulating configuration, following indentations or irregularities that are left on the alumina substrate 1 consequent upon the formation of the electrode films 5 and 6 thereon.

Figure 3:
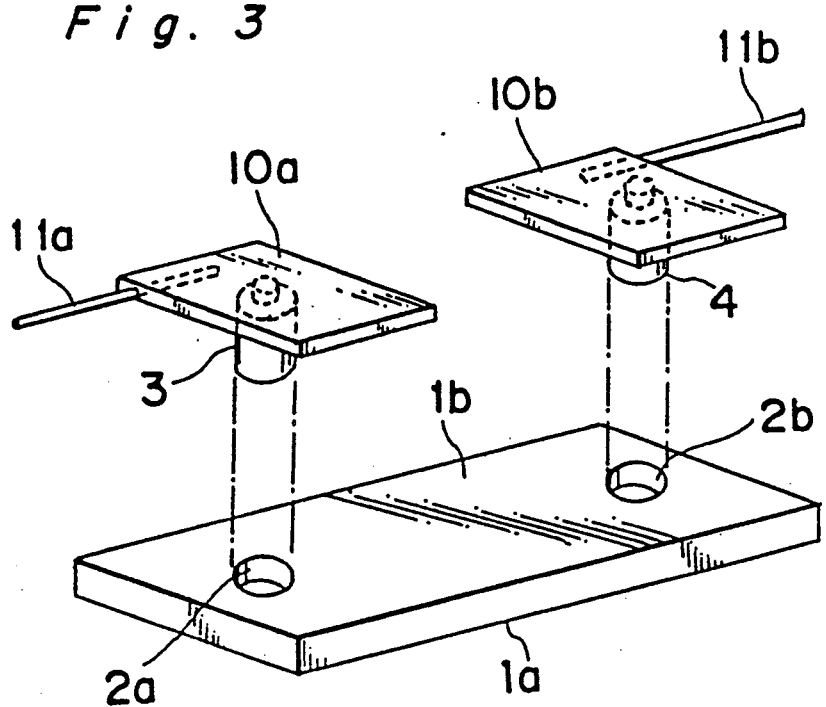
FIG. 3 is an exploded perspective view showing a connection between internal lead wires and intervening conductors, which can be employed in the embodiments of FIGS. 1 and 2, respectively.

After the deposition of the SiC film 8 on the alumina substrate 1 so as to overlay the electrode films 5 and 6 in the manner described hereinabove, lead wires are electrically connected to the respective body portions 5a and 6a of the electrode films 5 and 6. This connection may be accomplished according to a method shown in either of FIGS. 3 and 4, reference to which will now be made for the detailed discussion thereof.

Where the lead wires to be connected with the electrode films 5 and 6 and, specifically, with the respective body portions 5a and 6a of the electrode films 5 and 6, are employed in the form of internal lead wires which are encased within a thermistor package (not shown), they may be electrically connected with the electrode films 5 and 6 in the manner as shown in FIG. 3.

Referring to FIG. 3, while the electrode films 5 and 6 and the SiC film 8 are deposited on the first surface 1a of the alumina substrate 1 in the manner shown in and described with reference to FIGS. 1 and 2, thin-film electroconductive pieces 10a and 10b each having a generally square surface area of 1×1 to 1.5×1.5 mm in size are formed on the second surface 1b of the alumina substrate 1 in electrically connected relation with the associated tubular intervening conductors 3 and 4 in a manner similar to the formation of any one of the electrode films 5 and 6, i.e., by printing an electroconductive paste, preferably the same paste as used to form the tubular intervening conductors 3 and 4, and subsequently firing respective applied layers of electroconductive paste to complete the electroconductive pieces 10a and 10b, or by the use of any known metal vapor-deposition technique. Alternatively, since the electroconductive paste for the formation of the tubular intervening conductors 3 and 4 can be applied into the through-holes 2a and 2b from the second surface 1b of the alumina substrate 1 as hereinbefore described, the electroconductive pieces 10a and 10b may be respective integral parts of the tubular intervening conductors 3 and 4.

The internal lead wires identified by 11a and 11b, respectively, are welded at one end to the respective electroconductive pieces 10a and 10b. Alternatively, respective ends of the internal lead wires 11a and 11b may be embedded in the associated electroconductive pieces 10a and 10b in electrically connected relation therewith during the formation of the latter on the second surface 1b of the alumina substrate 1. The ends of the respective internal lead wires 11a and 11b opposite to the ends thereof connected with the electroconductive pieces 10a and 10b may be welded to, or otherwise formed into, associated terminal members (not shown) which are disposed on and exposed outwardly from the thermistor package for external electric connection. Hence, the internal lead wires 11a and 11b are electrically connected with the respective electrode films 5 and 6 through the associated electroconductive pieces 10a and 10b and then through the tubular intervening conductors 3 and 4.

It will therefore readily be seen that, since the internal lead wires 11a and 11b are connected with the electroconductive pieces 10a and 10b, not direct with the body portions 5a and 6a of the electrode films 5 and 6, the SiC film 8 can be deposited over the entire area of the first surface 1a of the alumina substrate 1 so as to overlay the electrode films 5 and 6, thereby eliminating the need to use any masking member and, hence, a complicated masking job, hitherto used to pattern eventually formed SiC film fragments according to the layout of the electrode films.

Figure 4:
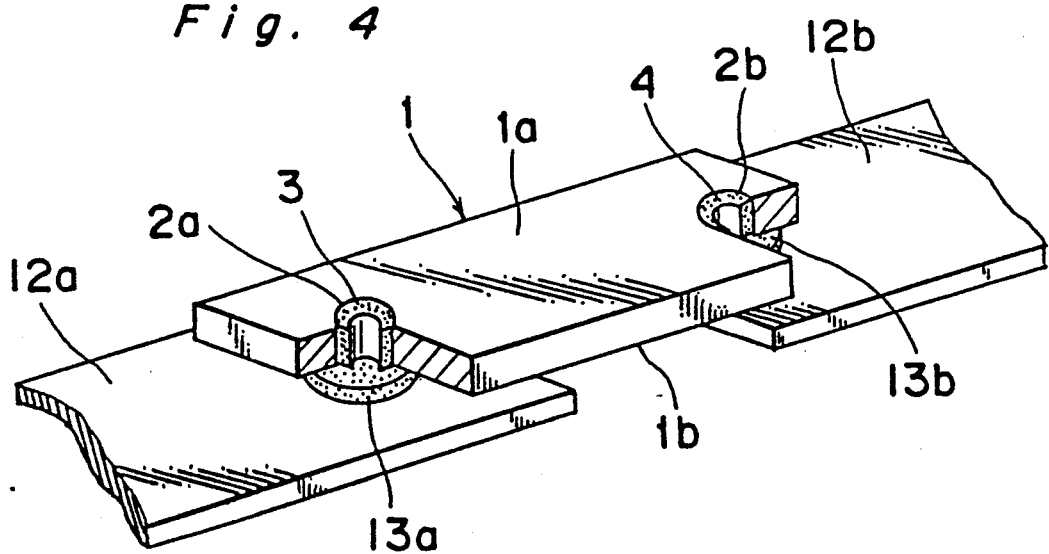
FIG. 4 is a view similar to FIG. 3, showing a connection between external lead wires and the intervening conductors, which can be employed in the embodiments of FIGS. 1 and 2.

With reference to FIG. 4, there is shown an example in which the lead wires are employed in the form of external lead wires which may be used for direct electrical connection with external circuit components. These external lead wires are identified by 12a and 12b each being in the form of a thin strip of preferably 0.1 to 0.5 mm in thickness. While the electrode films 5 and 6 and the SiC film 8 are deposited on the first surface 1a of the alumina substrate 1 in the manner shown in and described with reference to FIGS. 1 and 2, the external lead wires 12a and 12b are connected at one end directly with the tubular intervening conductors 3 and 4 through respective annular conductive flanges 13a and 13b.

Each annular conductive flange 13a and 13b connected electrically with the associated tubular intervening conductor 3 and 4 is formed by dropping a small quantity of electroconductive paste onto one end of the associated external lead wire 12a and 12b, placing the associated external lead wire 12a and 12b on the second surface 1b of the alumina substrate 1 with the droplet of electroconductive paste aligned with the associated tubular intervening conductor 3 and 4, applying a pressure necessary to hold the associated external lead wire 12a and 12b and the alumina substrate 1 together, and firing the assembly to complete the electric connection between the associated tubular intervening conductor 3 and 4 and the external lead wire 12a and 12b. Thus, each fired annular conductive flange 13a and 13b may be considered a spread of electroconductive paste which has been fixed in position as a result of the firing.

According to the method shown in and described with reference to FIG. 4, not only is the necessity of masking substantially eliminated, but also the need to use any internal lead wires is dispensed with. The electroconductive paste used to form the annular conductive flanges 13a and 13b may be identical with that used for the formation of the tubular intervening conductors 3 and 4. Also, for the external lead wires 12a and 12b, thin strips of Fe-Cr alloy, Ti or Pt may be employed because this material can, when heated, exhibit a thermal expansion substantially equal to that exhibited by the alumina substrate 1.

Where the thermistor element according to the present invention is in practice employed as a temperature sensor installed in, for example, an electronic oven, the thermistor element is preferably encased in a protective package made preferably of glass so as to thereby protect the thermistor element from moisture, dust and other harmful matter generally found in the environment in which it is used. This protective package made of glass can be formed in any known manner by firing a glass paste. Preferably, the protective package so formed can, when subjected to the elevated temperature, exhibit a thermal expansion generally equal to that exhibited by the alumina substrate 1.

In the foregoing description, the SiC film 8 serving as a temperature sensitive resistance element has been shown and described as formed by the use of the high frequency sputtering technique. However, it is apparent to those skilled in the art that the temperature sensitive resistance element may be formed of any suitable material such as, for example, platinum (Pt) in the form of either a thick film or a thin film, in place of the silicon carbide (SiC). In any event, the present invention can work out satisfactorily provided that the temperature sensitive resistance element is formed on the electrically insulating substrate 1 so as to overlay the electrode films 5 and 6.

Hereinafter, a method of making the thin-film thermistor using the SiC film 8 formed by the use of the radio frequency sputtering technique will be discussed.

As hereinbefore described, conventional electroconductive thick films are used as the tubular intervening conductors 3 and 4. For the electrode films 5 and 6, AuPt films fired at a temperature within the range of 900° to 1,000° C. are preferred. The sequence of formation of the electrode films 5 and 6 and the tubular intervening conductors 3 and 4 may not be limited to one particular order such as described above. By way of example, where the firing of the tubular intervening conductors 3 and 4 is followed by the firing of the electrode films 5 and 6, the firing temperature used to form the electrode films 5 and 6 is preferred to be lower than the firing temperature used to form the tubular intervening conductors 3 and 4. The reverse may also be true. Thus, should the firing temperature used to form the electrode films 5 and 6 be different from that used to form the tubular intervening conductors 3 and 4, a two-step firing process is required. In such case, the use of inexpensive Ag-Pd electroconductive films is preferable for the tubular intervening conductors 3 and 4 since it can contribute to a reduction in manufacturing cost.

However, the use of the inexpensive Ag-Pd electroconductive films for the tubular intervening conductors 3 and 4 requires the firing or formation of the electrode films 5 and 6 to be followed by the firing or formation of the tubular intervening conductors 3 and 4 because the Ag-Pd films are fired at 850° C. to form the tubular intervening conductors 3 and 4.

On the other hand, the processing time may be advantageously reduced if the firing temperature used for the formation of the tubular intervening conductors 3 and 4 is selected equal to that for the formation of the electrode films 5 and 6 made of Au-Pt alloy, because both films can be fired simultaneously and at one time. Of the various known electroconductive films, the use of Au films, Pt films or Au-Pt films is preferred because they can be fired at a firing temperature within the range of 900° to 1,000° C. Although those films are expensive to make, they can advantageously provide a high reliability because of their superior thermal and chemical stability. It is to be noted that the maximum temperature to which the SiC thin-film thermistor used as a temperature sensor in the electronic oven may be exposed ranges from 300° to 500° C. and, therefore, the use of any one of the Au films, Pt films and Au-Pt films which can be fired at a firing temperature of 900° to 1,000° C. for the formation of the tubular intervening conductors 3 and 4 is preferred because their superior thermal stability at elevated temperature and their capability of contributing to the reduction in firing time.

Thereafter, the tubular intervening conductors 3 and 4 are electrically connected to the external lead wires 12a and 12b through the annular conductive flanges 13a and 13b to provide the thermistor element which is subsequently enclosed in the protective package made of glass.

It is to be noted that, throughout the process of making the SiC thin-film thermistor according to the present invention, the SiC film 8 is placed several times in the high temperature environments during, for example, the formation of the SiC film 8 itself and the connection of the internal or external lead wires with the tubular intervening conductors 3 and 4 and, therefore, the temperature dependence of the resistance of the SiC thin film 8 tends to vary under the influence of the elevated temperature. Specifically, the higher the firing temperature and/or the greater the number of firing steps, the higher the rate of change in both resistance and B constant. The B constant is a thermistor constant and is defined by an equation, $[\ln(R_1/R_2)]/(1/T_1 - 1/T_2)$, wherein $R_1$ and $R_2$ represent resistance values at temperatures $T_1(K)$ and $T_2(K)$, respectively. On the other hand, when it comes to a mass production of the SiC thin-film thermistors, the amount of change in resistance and that of change in B constant before and after the firing processes are required to be stable below ±5% and below ±1%, respectively. Because of this, it is preferred that the firing temperature and the number of times over which the firing is performed be not higher than 700° C. and not greater than 2, respectively.

On the other hand, a transition temperature of the fired glass forming the protective package is preferably higher than an operating temperature of the SiC thin-film thermistor. However, the higher the transition temperature, the higher the firing temperature. Accordingly, considering that the SiC thin-film thermistor used as the temperature sensor in the electronic oven is operated at the operating temperature ranging from 300° to 500° C., the firing temperature is required to be higher than 650° C.

From the discussion given above, the firing temperature at which the applied electroconductive paste is to be fired to form the annular conductive flanges 13a and 13b and also at which the glass is fired to form the protective package is preferably chosen to be within the range of 650° to 700° C. Although the firing temperature for the formation of the annular conductive flanges 13a and 13b and that for the protective package may differ from each other, the use of the same firing temperature is preferred by a reason similar to that discussed in connection with the firing used to form the electrode films 5 and 6 and the tubular intervening conductors 3 and 4. Also, of the various known electroconductive films, the use of Au films, Pt films or Au-Pt films, which can be fired at the firing temperature of 650° to 700° C., is preferred as material for the annular conductive flanges 13a and 13b by a reason similar to that discussed in connection with the formation of the electrode films 5 and 6 and the tubular intervening conductors 3 and 4.

While the SiC thin-film thermistor according to the present invention is manufactured in the manner as hereinbefore described, the connection shown in and described with reference to FIG. 4 may bring about an undesirable increase in resistance between the external lead wires 12a and 12b and the associated annular conductive flanges 13a and 13b. According to the connection shown in and described with reference to FIG. 3, respective contact resistances between the internal lead wires 11a and 11b and the respective electroconductive pieces 10a and 10b are low of 0.1 ohm, because of the use of the welding technique to connect them together, and can therefore be negligible as compared with the characteristic resistance of the resultant thermistor. However, according to the connection shown in FIG. 4, it may occur that surfaces of the external lead wires 12a and 12b may be oxidized during the firing process and, therefore, it appears that the contact resistances between the external lead wires 12a and 12b and the respective annular conductive flanges 13a and 13b may be higher than that afforded by the connection shown in FIG. 3.

In order to ascertain the contact resistance between each external lead wire 13a and 13b, made of an Fe-Cr alloy, and the associated annular conductive flange 13a and 13b which has been formed by firing the Au containing paste at 700° C. for 10 minutes, the inventors of the present invention have conducted an experiment to measure a V-I characteristic exhibited therebetween. The result of the experiment has shown that the I-V characteristic between each external lead wire 13a and 13b and the associated annular conductive flange 13a and 13b was of a linear nature as long as the direct current used for the measurement was within the range of 1 to 200 µA. This indicates that the contact resistance remains constant and independent of applied voltage and current. The contact resistance was also measured in the temperature range of 20° to 400° C. and was found to have decreased with an increase in temperature. Typical values of contact resistance were found to be 2 to 6 ohms at 20° C. and 0.5 to 1.5 ohm at 400° C., both of which were found to be not higher than 0.15% of the characteristic resistance of the thermistor which is typically 400 to 600 kilo-ohms at 20° C. and 2 to 4 kilo-ohms at 400° C.

It is apparent from the result of experiments conducted that, considering the resistance value of the SiC film 8, the contact resistance exhibited when the external lead wires are connected to the respective electrode films in the manner shown in and described with reference to FIG. 4 is negligible even though higher than that exhibited when the internal lead wires are connected with the respective electrode films in the manner shown in and described with reference to FIG. 3.

Although the present invention has been described in connection with the preferred embodiments thereof with reference to the accompanying drawings, it is to be noted that various changes and modifications are apparent to those skilled in the art. For example, although the electrode films 5 and 6 have been shown and described as including one prong 5b and two spaced apart prongs 6a, respectively, the shape of each of the electrode films 5 and 6 may not be always limited thereto and may be of a generally comb-like shape. Where the electrode films 5 and 6 include respective pluralities of prongs arranged in a generally comb-like configuration, the prongs in one electrode film may be interleaved with the prongs in the other electrode film.

Such changes and modifications are to be construed as included within the scope of the present invention as defined by the appended claims, unless they depart therefrom.

What is claimed is:

1. A thin-film thermistor which comprises:
   an electrically insulating substrate having first and second surfaces opposite to each other and also having a pair of through-holes defined therein so as to extend completely across the thickness thereof, each of said through-holes being delimited by a surrounding wall face;
   a pair of electrode films each including a body portion of large surface area and a generally comb-shaped portion continued outwardly from said body portion, said electrode films being formed on the first surface of the substrate with the comb-shaped portion of one of the electrode films confronting with the comb-shaped portion of one of the electrode films confronting with the comb-shaped portion of the other of the electrode films;
   first and second electroconductive films formed on the surrounding wall faces of the respective through-holes in the substrate in electrically connected relationship with the body portions of the associated electrode films;
   a temperature sensitive resistance film formed on the first surface of the substrate so as to overlay the electrode films
   first and second fired electroconductive pieces connected electrically with the first and second electroconductive films, respectively; and
   a pair of metallic strips at least partially disposed on said second surface of said substrate and connected electrically with the first and second fired electroconductive pieces, respectively.

2. The thermistor as claimed in claim 1, wherein each of said metallic strips is made of an Fe-Cr alloy.

3. The thermistor as claimed in claim 1, further comprising a protective package made of fired glass and enclosing the thermistor therein.

4. The thermistor as claimed in claim 1, wherein each of said metallic strips has a thickness within a range of from 0.1 to 0.5 mm.

5. The thermistor as claimed in claim 4, wherein each of said metallic strips is made of an Fe-Cr alloy.

6. The thermistor as claimed in claim 4, further comprising a protective package made of fired glass and enclosing the thermistor therein.

7. The thermistor as claimed in claim 5, further comprising a protective package made of fired glass and enclosing the thermistor therein.

8. A method of manufacturing a SiC thin-film thermistor element, which comprises the steps of:
   preparing an electrically insulating substrate having first and second surfaces opposite to each other and also having a pair of through-holes defined therein so as to extend completely across the thickness thereof, each of said through-holes being delimited by a surrounding wall face;
   forming a pair of electrode films on the first surface of the substrate by the use of a first firing process, each of said electrode films including a body portion of large surface area and a generally comb-shaped portion continued outwardly from said body portion, said comb-shaped portions of the respective electrode films being positioned so as to confront with each other;

forming first and second electroconductive films on the surrounding wall faces of the respective through-holes in the substrate in electrically connected relationship with the body portions of the associated electrode films by the use of a second firing process; and depositing, by the use of a high frequency sputtering process, a SiC film on the first surface of the substrate so as to overlay the electrode films.

9. The method as claimed in claim 8, wherein the temperature at which the first firing process is performed to form the electrode films is equal to the temperature at which the second firing process is performed to form the first and second electroconductive films.

10. The method as claimed in claim 8, further comprising a step of preparing a pair of metallic strips each having a thickness within the range of 0.1 to 0.5 mm, a step of connecting the metallic strips with the first and second electroconductive films through respective fired electroconductive elements, and a step of enclosing the thermistor element in a protective package made of fired glass.

11. The method as claimed in claim 10, wherein the temperature at which the fired electroconductive elements are fired is equal to the temperature at which the glass is fired to form the protective package.

12. The method as claimed in claim 11, wherein said temperature is within the range of 650° to 700° C.

* * * * *